US006888780B2

(12) United States Patent
Happer et al.

(10) Patent No.: US 6,888,780 B2
(45) Date of Patent: May 3, 2005

(54) METHOD AND SYSTEM FOR OPERATING AN ATOMIC CLOCK WITH SIMULTANEOUS LOCKING OF FIELD AND FREQUENCY

(75) Inventors: William Happer, Princeton, NJ (US); Nicholas N. Kuzma, Princeton, NJ (US)

(73) Assignee: Princeton University, Princeton, NJ (US)

( * ) Notice: Subject to any disclaimer, the term of this patent is extended or adjusted under 35 U.S.C. 154(b) by 10 days.

(21) Appl. No.: 10/799,105

(22) Filed: Mar. 12, 2004

(65) Prior Publication Data

US 2004/0202050 A1 Oct. 14, 2004

Related U.S. Application Data

(60) Provisional application No. 60/462,035, filed on Apr. 11, 2003.

(51) Int. Cl.[7] ........................... G04B 47/00; G04F 5/00; G01V 3/00; H03L 7/26

(52) U.S. Cl. ......................... 368/10; 368/156; 324/301; 324/304; 331/3; 331/94.1

(58) Field of Search ........................... 368/10, 155–156; 324/300, 301, 304; 331/1 R, 3, 5, 94

(56) References Cited

U.S. PATENT DOCUMENTS

| | | | | |
|---|---|---|---|---|
| 2,951,992 A | | 4/1960 | Arditi | 331/3 |
| 3,159,797 A | * | 12/1964 | Whitehorn | 331/3 |
| 3,214,683 A | * | 10/1965 | Andres | 324/304 |
| 3,252,081 A | * | 5/1966 | Ruddock et al. | 324/301 |
| 3,641,426 A | * | 2/1972 | Brun et al. | 324/304 |
| 3,863,144 A | * | 1/1975 | Simpson et al. | 324/301 |
| 5,225,778 A | * | 7/1993 | Chaillout et al. | 324/304 |

OTHER PUBLICATIONS

Bell, W et al., "Optical Detection of Magnetic Resonance in Alkali Metal Vapor", Physical Review, vol. 107, No. 6, Sep. 15, 1657, pp 1559–1565.

* cited by examiner

*Primary Examiner*—Vit W. Miska
(74) *Attorney, Agent, or Firm*—Mathews, Collins, Shepherd & McKay, P.A.

(57) ABSTRACT

The present invention provides a method and system to simultaneously use the microwave and Zeeman end resonances associated with the same sublevel of maximum (or minimum) azimuthal quantum number m to lock both the atomic clock frequency and the magnetic field to definite values. This eliminates the concern about the field dependence of the end-resonance frequency. In an embodiment of the system of the present invention, alkali metal vapor is pumped with circularly-polarized $D_1$ laser light that is intensity-modulated at appropriate resonance frequencies, thereby providing coherent population trapping (CPT) resonances. In another embodiment, pumping with constant-intensity circularly-polarized $D_1$ laser light enhances magnetic resonances that are excited by alternating magnetic fields oscillating at appropriate resonance frequencies. In both embodiments, the resonances are greatly enhanced by concentrating most of the atoms in the initial state of the resonances, and by diminishing the spin-exchange broadening of the resonances. This leads to greater stability of optically pumped atomic clocks. This invention can also be used to operate an atomic magnetometer, where the feedback signal used to stabilize the magnetic field at the alkali-vapor cell can serve as a sensitive measure of the ambient magnetic field.

32 Claims, 7 Drawing Sheets

30

Optically pumping atoms into a ground-state sublevel of maximum (or minimum) spin *m* from which end resonances can be excited

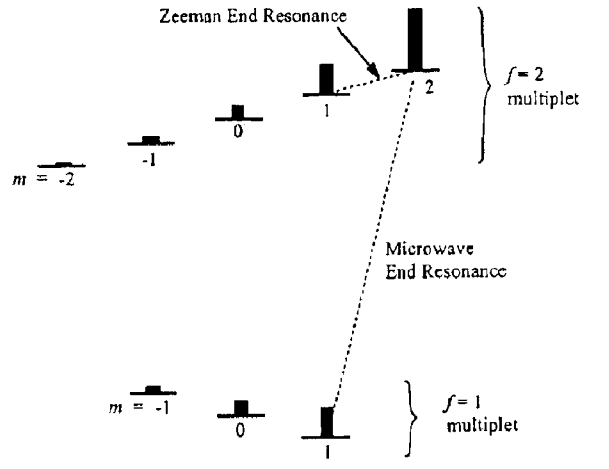

32

Simultaneously exciting a microwave end transition and a Zeeman end transition in the atoms with laser light doubly modulated at, or magnetic fields simultaneously oscillating at a microwave frequency of the end resonance and a Zeeman frequency of the end resonance

34

Adjusting the applied magnetic field and the oscillator frequency used for generating the microwave frequency and Zeeman frequency in such a way as to maximize the photo detector signal

36

FIG. 3

METHOD AND SYSTEM FOR OPERATING AN ATOMIC CLOCK WITH SIMULTANEOUS LOCKING OF FIELD AND FREQUENCY

CROSS REFERENCE TO RELATED APPLICATION

This application claims priority to U.S. Provisional Application No. 60/462,035, filed on Apr. 11, 2003, the disclosure of which is hereby incorporated by reference in its entirety.

BACKGROUND OF THE INVENTION

1. Field of the Invention

The present invention relates to the field of optically pumped atomic clocks or magnetometers, and more particularly to atomic clocks or magnetometers having simultaneous locking of field and frequency with end resonances.

2. Description of the Related Art

Conventional, gas-cell atomic clocks utilize optically pumped alkali-metal vapors. Atomic clocks are utilized in various systems which require extremely accurate frequency measurements. For example, atomic clocks are used in GPS (global positioning system) satellites and other navigation and positioning systems, as well as in cellular phone systems, scientific experiments and military applications.

In one type of atomic clock, a cell containing an active medium, such as rubidium or cesium vapor, is irradiated with both optical and microwave power. The cell contains a few droplets of alkali metal and an inert buffer gas at a fraction of an atmosphere of pressure. Light from the optical source pumps the atoms of the alkali-metal vapor from a ground state to an optically excited state, from which the atoms fall back to the ground state, either by emission of fluorescent light or by quenching collisions with a buffer gas molecule like $N_2$. The wavelength and polarization of the light are chosen to ensure that some ground state sublevels are selectively depopulated, and other sublevels are overpopulated compared to the normal, nearly uniform distribution of atoms between the sublevels. It is also possible to excite the same resonances by modulating the light at the Bohr frequency of the resonance, as first pointed out by Bell and Bloom, W. E. Bell and A. L. Bloom, Phys. Rev. 107, 1559 (1957), hereby incorporated by reference into this application. The redistribution of atoms between the ground-state sublevels changes the transparency of the vapor so a different amount of light passes through the vapor to a photo detector that measures the transmission of the pumping beam, or to photo detectors that measure fluorescent light scattered out of the beam. If an oscillating magnetic field with a frequency equal to one of the Bohr frequencies of the atoms is applied to the vapor, the population imbalances between the ground-state sublevels are eliminated and the transparency of the vapor returns to its unpumped value. The changes in the transparency of the vapor are used to lock a clock or magnetometer to the Bohr frequencies of the alkali-metal atoms.

The Bohr frequency of a gas cell atomic clock is the frequency ν with which the electron spin S processes about the nuclear spin I for an alkali-metal atom in its ground state. The precession is caused by the magnetic hyperfine interaction. Approximate clock frequencies are ν=6.835 GHz for $^{87}$Rb and ν=9.193 GHz for $^{133}$Cs. Conventionally, clocks have used the "0—0" resonance which is the transition between an upper energy level with azimuthal quantum number m=0 and total angular momentum quantum number $f=I+½$, and a lower energy level, also with azimuthal quantum number m=0 but with total angular momentum quantum number $f=I-½$.

For atomic clocks, it is important to maintain the minimum uncertainty, δν, of the resonance frequency ν. The frequency uncertainty is approximately given by the ratio of the resonance linewidth, Δν, to the signal-to-noise ratio, SNR, of the resonance line. That is, δν=Δν/SNR. Clearly, one would like to use resonances with the smallest possible linewidth, Δν, and the largest possible signal-to-noise ratio, SNR.

For miniature atomic clocks it is necessary to increase the density of the alkali-metal vapor to compensate for the smaller physical path length through the vapor. The increased vapor density leads to more rapid collisions between alkali-metal atoms. These collisions are a potent source of resonance line broadening. While an alkali-metal atom can collide millions of times with a buffer-gas molecule, like nitrogen or argon, with no perturbation of the resonance, every collision between alkali-metal atoms interrupts the resonance and broadens the resonance linewidth. The broadening mechanism is "spin exchange," the exchange of electron spins within a pair of alkali-metal atoms during a collision. The spin-exchange broadening puts fundamental limits on how small such clocks can be. Smaller clocks require larger vapor densities to ensure that the pumping light is absorbed in a shorter path length. The higher atomic density leads to larger spin-exchange broadening of the resonance lines, and makes the resonance lines less suitable for locking a clock frequency or a magnetometer frequency.

U.S. Pat. No. 2,951,992 describes an atomic frequency standard having a pair of cells of alkali metal vapor in which a substantially homogenous static magnetic field permeates both cells and energy of a sum frequency of a frequency source and an interpolation generator is applied to one cell to excite hyperfine ground energy level transitions therein, and energy of a difference frequency of same frequency source and same interpolation generator is applied to the other of the cells to excite microwave hyperfine energy level transitions in the other cell.

It is desirable to provide a method and system for using end resonances for providing simultaneous locking of field and frequency in the same cell in order to eliminate most of the sensitivity to field differences between the two cells, and to operate atomic clocks at much higher densities of alkali-metal atoms than conventional systems.

SUMMARY OF THE INVENTION

Co-pending U.S. patent application Ser. No. 10/620,159, hereby incorporated by reference in its entirety into this application, relates to a method and system for using end resonances of highly spin-polarized alkali metal vapors for an atomic clock, magnetometer or other system. A left end resonance involves a transition from the quantum state of minimum spin angular momentum along the direction of the magnetic field. The traditional 0—0 resonance and the end resonances of $^{87}Rb$ vapor are shown in FIG. 1.

A right end resonance involves a transition from the quantum state of maximum spin angular momentum along the direction of the magnetic field. For each quantum state of extreme spin there are two end resonances, a microwave resonance and a Zeeman resonance. For $^{87}Rb$, the microwave end resonance occurs at a frequency of approximately 6.8 GHz and for $^{133}Cs$ the microwave end resonance frequency is approximately 9.2 GHz. The Zeeman end resonance frequency is very nearly proportional to the magnetic field. For $^{87}Rb$ the Zeeman end resonance frequency is approximately 700 kHz/G, and for $^{133}Cs$ the Zeeman end resonance frequency is approximately 350 kHz/G. It is desirable to use left and right microwave end resonances for an atomic clock. The fundamental problem is that the right end resonance requires the atoms to be in states with the maximum possible azimuthal quantum number $m=I+½$ and the left end resonance requires the atoms to be states with the minimum possible azimuthal quantum number $m=-I-½$. The present invention provides a method and apparatus for simultaneously exciting a microwave end transition and a Zeeman end transition with doubly-modulated laser light or with alternating magnetic fields, oscillating at the frequencies of both transitions, and setting the ratios between the obtained signal frequencies and the local oscillator frequency to preset integer values, thereby locking both the local-oscillator frequency and the total magnetic field at the alkali-vapor cell.

The present invention provides a method and system to simultaneously use the microwave and Zeeman end resonances associated with the same sublevel of maximum (or minimum) azimuthal quantum number m to lock both the clock frequency and the total magnetic field to definite values. This eliminates the concern about the magnetic-field dependence of the end-resonance frequency. In one embodiment of the system of the present invention, alkali metal vapor is pumped with circularly polarized $D_1$ laser light that is intensity modulated at appropriate resonance frequencies, thereby providing coherent population trapping (CPT) resonances, that can be observed as an increase in the mean transmittance of the alkali-metal vapor. In a closely related embodiment, circularly polarized pumping light of fixed intensity is used to pump the atoms into the right (or left) end state, depending on the helicity of the light, and the resonances are excited by magnetic fields oscillating at the microwave and Zeeman end-resonance frequencies.

The invention will be more fully described by reference to the following drawings.

BRIEF DESCRIPTION OF THE DRAWINGS

FIG. 3 is a flow diagram of a method of operating an atomic clock in accordance with the teachings of the present invention.

DETAILED DESCRIPTION

Figure 1:
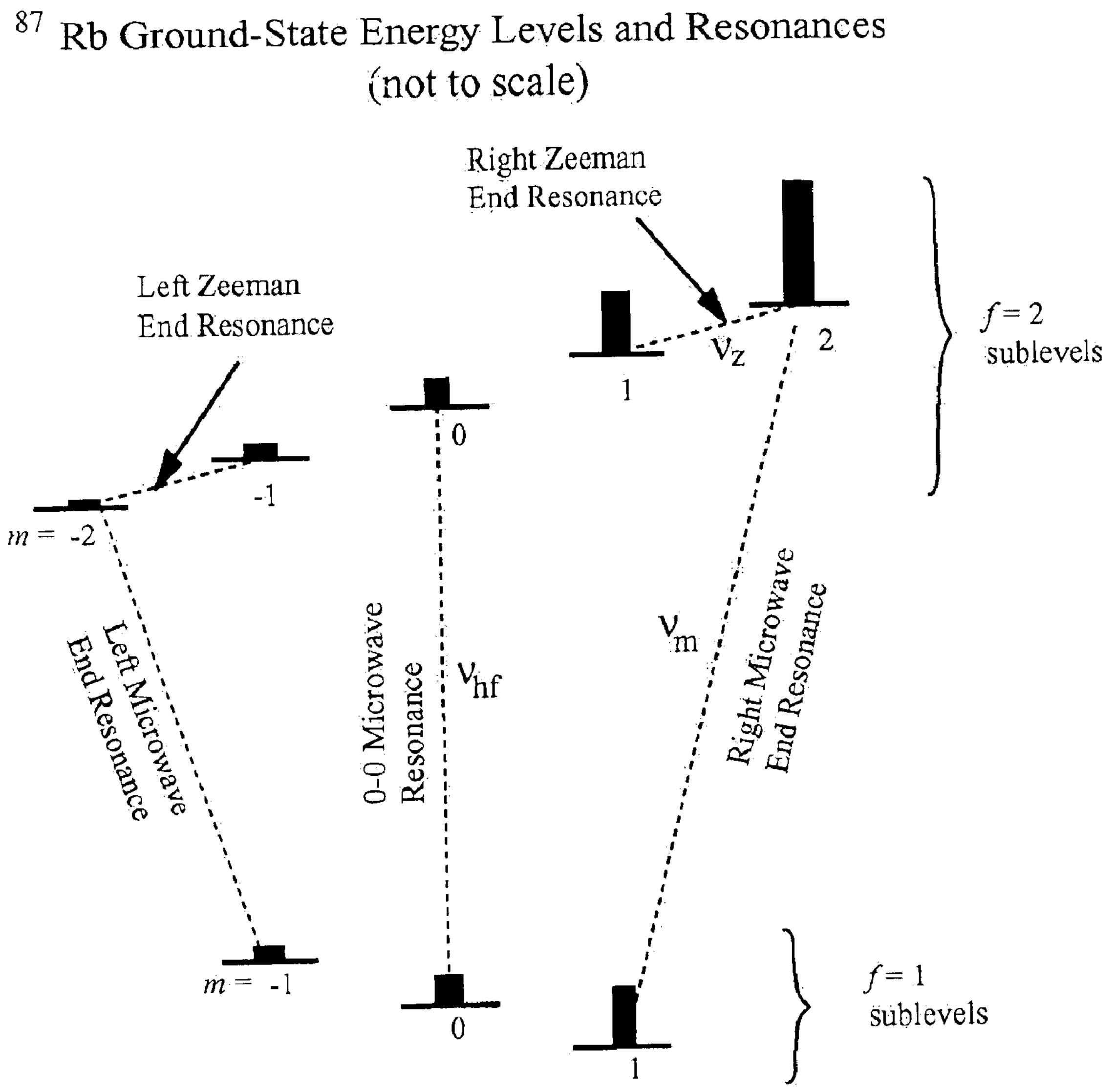
FIG. 1 is a graph of $^{87}Rb$ ground-state energy levels and resonances.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
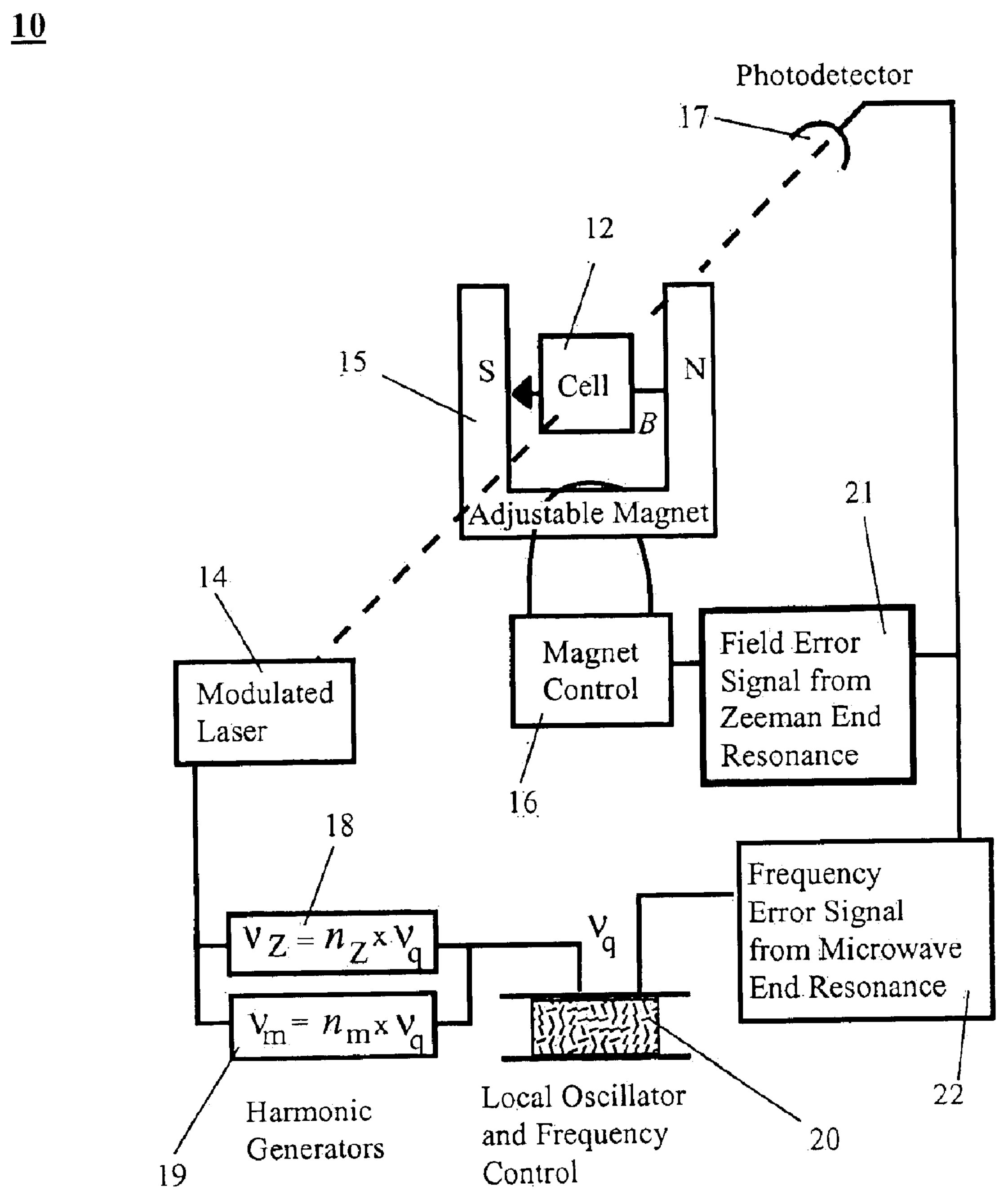
FIG. 2 is a schematic diagram of a system of operating an atomic clock in accordance with the teachings of the present invention.

FIG. 2 is a schematic diagram of atomic clock 10 in accordance with the teachings of the present invention. Cell 12 contains an active medium. For example, cell 12 can contain cesium (Cs) or rubidium (Rb) vapor and buffer gas or gasses. Laser 14 produces optical pumping in cell 12. Adjustable magnet means 15, 16 provides and stabilizes magnetic field B. Photo detector 17 detects laser light transmitted through cell 12. Alternatively, detection can be through changes in fluorescent emission of the light by the atoms.

In one embodiment, laser 14 emits circularly polarized $D_1$ laser light. Laser 14 is modulated simultaneously by modulation frequency intensities generated by harmonic generator 18 and harmonic generator 19. Harmonic generator 18 is used to generate a frequency $\nu_z$ of the right Zeeman end resonance. Harmonic generator 19 is used to generate a frequency $\nu_m$ of the right microwave end resonance. Oscillator 20 can be a small quartz-crystal or other stable local-oscillator "flywheel" providing a frequency $\nu_q$. A high harmonic of the frequency $\nu_q$ is generated by harmonic generator 18 which is used to generate a microwave end-resonance frequency of the $^{87}Rb$ or $^{133}Cs$ atoms. A frequency of the corresponding Zeeman end transition from $\nu_q$ is generated using a low harmonic or a subharmonic of the frequency $\nu_q$ generated by harmonic or subharmonic generator 19. The microwave and Zeeman right end resonances share a common sublevel, as shown in FIG. 1. Feedback control loops 21, 22 adjust the magnetic field B at cell 12 by controlling adjustable magnet means 15, 16 and local-oscillator frequency $\nu_q$ of oscillator 20 to maximize light reaching photo detector 17. The frequency of oscillator 20 is always related to the locking frequencies generated by harmonic generator 18 and harmonic generator 19 by preset integer ratios $n_z$ and $n_m$ which are fixed by the design of the harmonic generators 18 and 19. These two preset, fixed ratios $n_z=\nu_z/\nu_q$ and $n_m=\nu_m/\nu_q$ completely determine the unique values of oscillator frequency $\nu_q$ and magnetic field B at which the CPT resonance occurs, that is at which the vapor in cell 12 is maximally transparent. Feedback control loop 21 can determine a field error signal from the Zeeman end resonance for control of the magnetic field B. Feedback control loop 22 can determine a frequency error signal from the microwave end resonance for adjusting the frequency $\nu_q$.

FIG. 3 is a flow diagram of a method for operating an atomic clock 30 in accordance with the teachings of the present invention. In block 32, atoms are optically pumped into a ground-state sublevel having maximum or minimum azimuthal spin angular momentum m. The quantum numbers $f$ and m are used to label the ground-state sublevels of the alkali-metal atom. Here $f$ is the quantum number of the total spin, electronic plus nuclear, of the atom, and m, is the azimuthal quantum number, the projection of the total spin along the direction of the magnetic field. The possible values of $f$ are $f$=I+½=a or $f$=I−½=b, and the possible values of m are m=$f$ $f$−1, $f$−2, . . . , −$f$. For example, for a right microwave end resonance, the initial state i, of maximum spin angular momentum has the quantum numbers, $f_i$, $m_i$=a, a. For the same resonance, the corresponding final state j will have the quantum numbers $f_j$, $m_j$=b, b. Most of the atoms can be placed in the initial state by pumping the vapor with circularly polarized light for which the photon spins have one unit of angular momentum parallel to the direction of the magnetic field.

Figure 7:
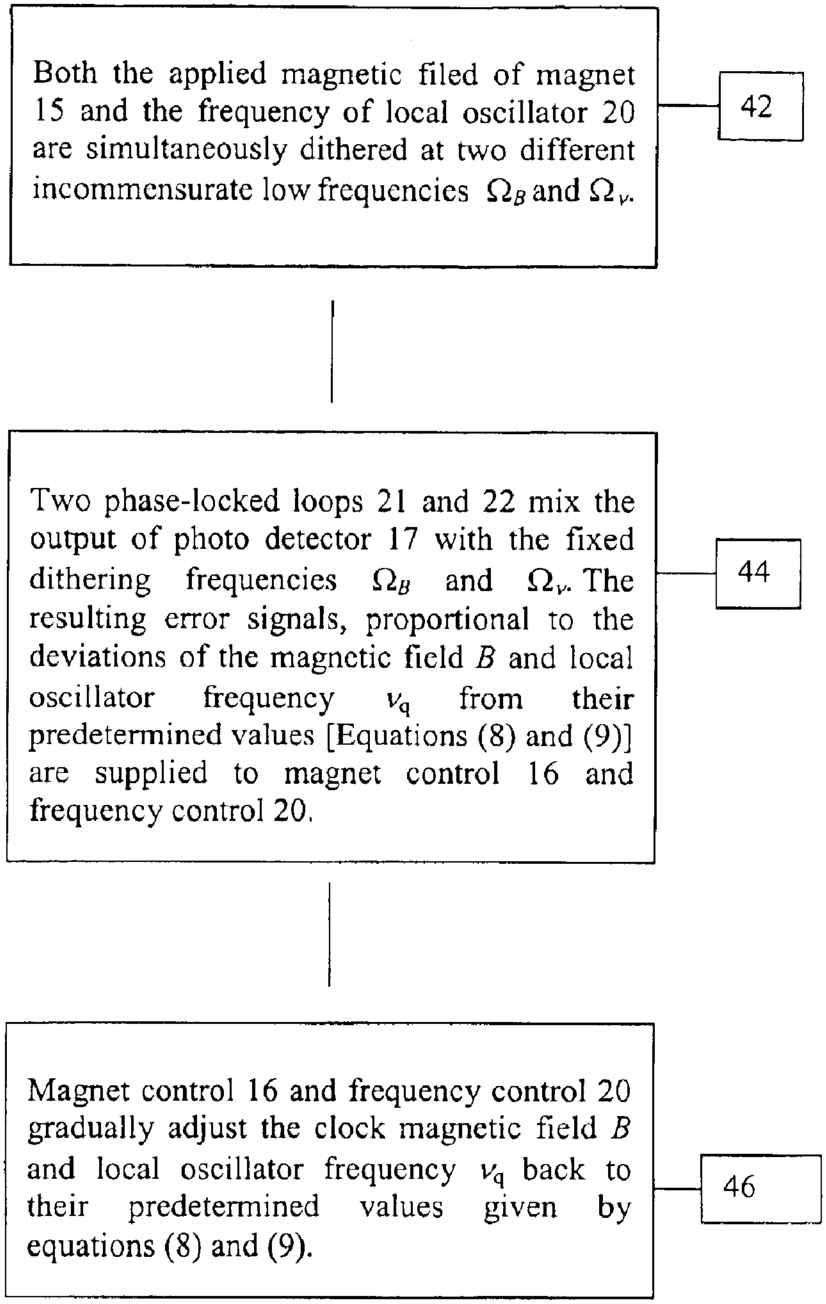
FIG. 7 is a flow diagram of a method for adjusting the local oscillator frequency and the magnetic field.

In block 34, a microwave end transition and a Zeeman end transition are simultaneously excited with laser light modulated at, or alternating magnetic fields simultaneously oscillating at a microwave frequency of the microwave end resonance and a radio-frequency of the Zeeman end resonance. In block 36, an applied magnetic field and a local oscillator frequency used for generating the microwave frequency and Zeeman frequency are adjusted in such a way as to maximize the photo detector signal. An embodiment for implementing block 36 is shown in FIG. 7. The end-resonance frequencies can be written as a power series in the magnetic field B. In this embodiment, the expansion is limited to the first power of B and terms of order $B^2$ are ignored. It will be appreciated that the following description can be used for the exact expression for the frequencies. The present embodiment relates to a clock based on $^{87}$Rb with the nuclear spin quantum number I=3/2. It will be appreciated that the same teachings apply to $^{133}$Cs, having a nuclear spin quantum number of $^{133}$Cs of I=7/2 and twice as many Zeeman sublevels. To first order in B, the frequencies of the left and right Zeeman end resonances are the same and are equal to $$\nu_z = \frac{\gamma B}{[I]}. \quad (1)$$

The gyromagnetic ratio is $$\gamma = \frac{g\mu_B}{h} = 2.8025\ \mathrm{MHzG}^{-1}. \quad (2)$$

The Bohr magneton is $\mu_B$=9.274×10$^{-21}$ erg G$^{-1}$, the g factor of the electron is g=2.0023, and Planck's constant is h=6.626×10$^{-27}$ erg sec. The statistical weight of the nuclear spin is denoted [I]=2I+1. For $^{87}$Rb we have I=3/2 and [I]=4, and for $^{133}$Cs, I=7/2 and [I]=8. The magnetic field B will be comparable to the Earth's field.

To first order in B, the frequency of the right microwave end resonance is $$\nu_m = \nu_{hf} + \frac{2I\gamma B}{[I]}. \quad (3)$$

The hyperfine frequencies are $\nu_{hf}$=6834.7 MHz for $^{87}$Rb and $\nu_{hf}$=9192.6 MHz for $^{133}$Cs. The buffer gas may shift $\nu_{hf}$ slightly, and this shift can depend on temperature. The temperature-dependent shifts can be minimized by using an appropriate mixture of gases with positive and negative pressure-shift coefficients, as is currently done with conventional atomic clocks as described in U.S. Pat. No. 2,951,992, hereby incorporated in its entirety into this application.

The microwave frequency of equation (3) will be much larger than the Zeeman frequency of equation (1). For example, if B=1 G, about twice the ordinary Earth's field, the following relationship is shown $$\frac{\nu_m}{\nu_z} = \frac{[I]\nu_{hf}}{\gamma B} + 2I = \begin{cases} 9763.9 + 3 & \text{for } ^{87}Rb \\ 26264.6 + 7 & \text{for } ^{133}Cs. \end{cases} \quad (4)$$

From equation (4) it is shown that the resonance frequency of the Zeeman end transition of $^{87}$Rb is about 10,000 smaller than the hyperfine frequency, and the resonance frequency of the Zeeman end transition of $^{133}$Cs is about 25,000 smaller than the hyperfine frequency.

Let the Zeeman resonance frequency be the $n_z^{th}$ harmonic (or the $p_z$th subharmonic) of the local-oscillator frequency, $\nu_q$, such that $$n_z\nu_q = \frac{\gamma B}{[I]}. \quad (5)$$

If it is desirable to use a Zeeman frequency lower than the local-oscillator frequency $\nu_q$, the $p_z^{th}$ subharmonic can be used, and the frequency relation is $$\frac{\nu_q}{p_z} = \frac{\gamma B}{[I]}, \quad (6)$$

wherein $n_z$ and $p_z$ are positive integers.

If the microwave resonance frequency $\nu_m$ is the $n_m^{th}$ harmonic of the local-oscillator frequency, $\nu_q$, such that $\nu_m = n_m\nu_q$, it is found that $$n_m\nu_q = \nu_{hf} + \frac{2I\gamma B}{[I]}. \quad (7)$$

Solving equations (5) and (7) simultaneously, it is found that the ideal frequency of the local-oscillator is $$\nu_{qc} = \frac{\nu_{hf}}{n_m - 2In_z}, \quad (8)$$

and the ideal clock frequency is $$\nu_c = n_m\nu_{qc} = \frac{n_m\nu_{hf}}{n_m - 2In_z}. \quad (9)$$

The clock frequency of equation (9) is slightly larger (by a ratio of nearly equal, large integers $n_m$ and $n_m$−2I$n_z$) than the zero-field hyperfine frequency $\nu_{hf}$ of the atoms.

The ideal clock field is $$B_c = \frac{[I]n_z\nu_{qc}}{\gamma} = \frac{[I]n_z\nu_{hf}}{\gamma(n_m - 2In_z)}. \quad (10)$$

As described above, the field dependence can be eliminated by simply locking the magnetic field to a preset value of equation (10). Accordingly, the field cannot drift and the fact that the microwave end transition is field-dependent does not matter.

To produce coherent population trapping (CPT) resonances, the vapor can be excited with light which is intensity-modulated at the frequencies of the Zeeman and microwave end resonances. If the two modulation formats are applied simultaneously, the intensity of the incident pumping light is the following $$I = \frac{I_0}{4}\left[1 - \cos(2\pi n_z\nu_q t)\right]\left[1 - \cos(2\pi n_m\nu_q t)\right]. \quad (11)$$

Figure 4:
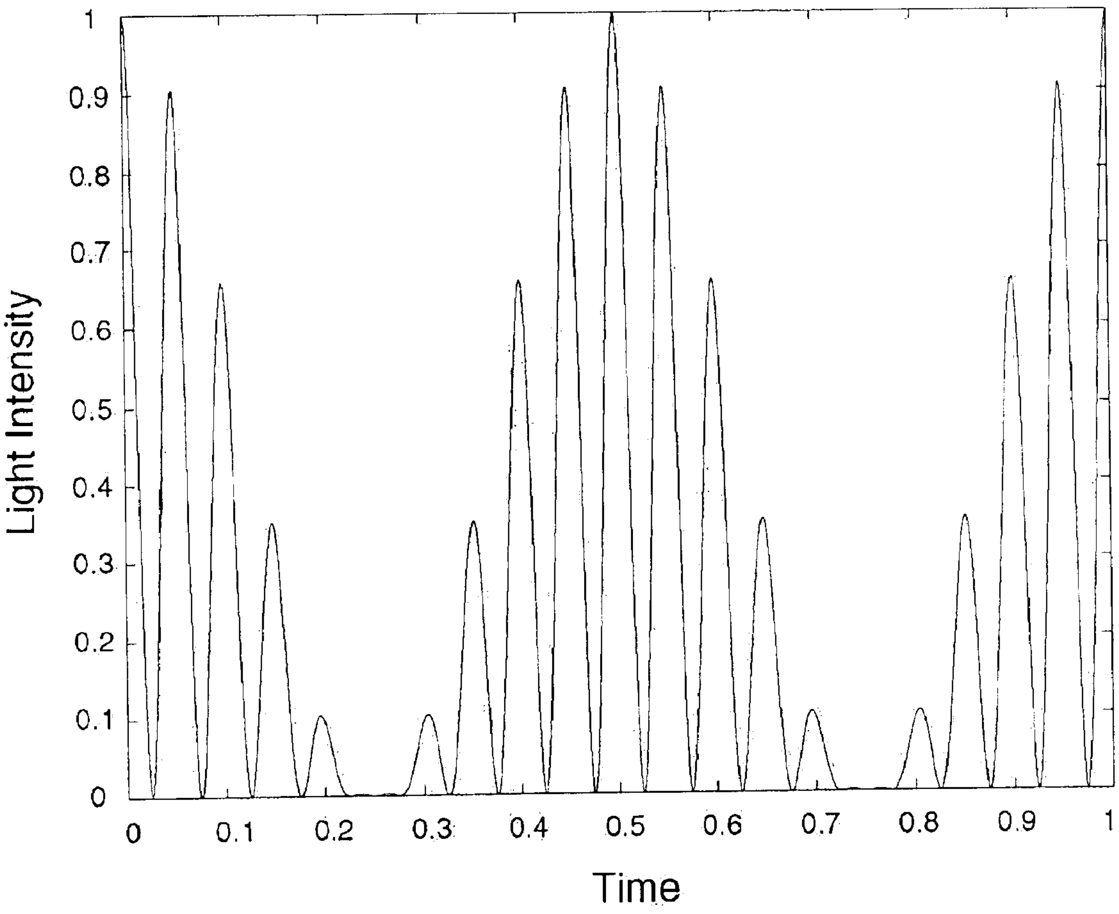
FIG. 4 is a graph of qualitative time dependence of light intensity, simultaneously modulated at the resonance frequencies of the Zeeman and microwave end transitions.

The sort of time dependence represented by equation (11) is shown in FIG. 4.

For simplicity, it is assumed that in the vapor the transmittance of light of laser 14, modulated at a frequency close to the frequency of the Zeeman end resonance is $$T_z = \frac{1}{1 + 4(n_z\nu_q - \gamma B/[I])^2/\Delta\nu_z^2}. \quad (12)$$

Here, $\Delta\nu_z$ is the full width at half maximum of the Zeeman end resonance, and the transmittance is time-averaged over one Zeeman modulation period.

In the same vapor, the transmittance of light modulated close to the design frequency of the microwave transition, will be $$T_m = \frac{1}{1 + 4(n_m\nu_q - \nu_{hf} - 2I\gamma B/[I])^2/\Delta\nu_m^2}, \quad (13)$$

where the full width at half maximum of the microwave end resonance is $\Delta\nu_m$.

Inevitable fluctuations of the magnetic field B and of the local-oscillator frequency $\nu_q$ can be written as $$B = B_c + \delta B \quad (14)$$

and $$\nu_q = \nu_{qc} + \delta\nu_q \quad (15)$$

In terms of these fluctuations, the transmittances of equation (12) and equation (13) become $$T_j = \frac{1}{1 + 4e_j^2/\Delta\nu_j^2}, \quad (16)$$

where the resonance index is j=Z or j=m, and the linear combinations $e_j$ of the field and frequency errors are $$e_z = n_z\delta\nu_q - \frac{\gamma\delta B}{[I]} \text{ and } e_m = n_m\delta\nu_q - \frac{2I\gamma\delta B}{[I]}. \quad (17)$$

Figure 5:
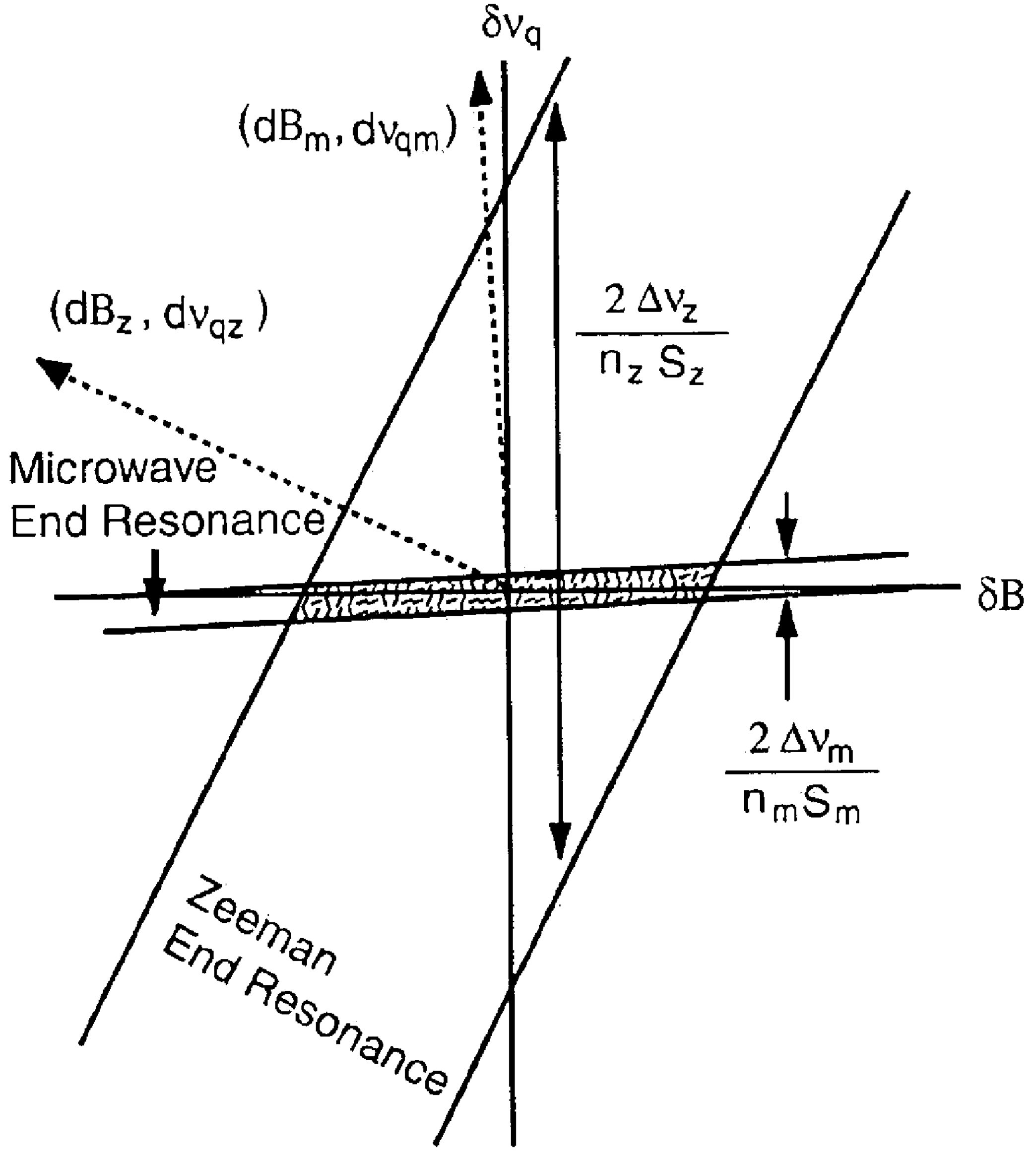
FIG. 5 is a plot of δB, uncertainty of the magnetic field, and $\delta\nu_q$, uncertainty of the local oscillator frequency, for intersection of locking ridges for Zeeman and microwave resonances within an error parallelogram.

The transmittances of equation (16) are "ridges" that intersect at the origin of the ($\delta$B, $\delta\nu_q$) plane, as shown in FIG. 5.

Feedback control loop 21 and feedback control loop 22 can be used to lock the field B and the local-oscillator frequency $\nu_q$ to their ideal respective values shown in equation (10) and equation (8). To lock with the end resonances, the field and frequency can be dithered such that $$B = B_c + \delta B + dB \cos \Omega_B t \quad (18)$$

and $$\nu = \nu_c + \delta\nu_q + d\nu_q \cos \Omega_\nu t \quad (19)$$

This step is shown in block 42 of FIG. 7.

The dither amplitudes $d\nu_q$ and dB are chosen to optimize the performance of feedback loop 21 and feedback loop 22.

Substituting equations (18) and (19) into equation (16), it is found that $$T_j = \frac{1}{1 + 4(e_j + df_j)^2/\Delta\nu_j^2}. \quad (20)$$

The dither detunings, $$df_z = n_z d\nu_q \cos\Omega_\nu t - \frac{\gamma dB}{[I]}\cos\Omega_B t \text{ and}$$
$$df_m = n_m d\nu_q \cos\Omega_\nu t - \frac{2I\gamma dB}{[I]}\cos\Omega_B t, \quad (21)$$

are quantities fixed by the design of the feedback system. The dither detunings can be chosen to be comparable to, or to be slightly smaller than the resonance linewidths $\Delta\nu_j$. The dither frequencies $\Omega_\nu$ and $\Omega_B$ are also chosen to be small compared to the natural linewidths $\Delta\nu_j$.

As shown in block 44 of FIG. 7, feedback loop 21 and feedback loop 22 mix the output of photo detector 17 with the fixed dithering frequencies $\Omega_B$ and $\Omega_\nu$. The resulting error signals, proportional to the deviations of the clock magnetic field B and local oscillator frequency $\nu_q$ from their predetermined values $B_c$ and $\nu_c$ are supplied to magnet control 16 and frequency control 20.

Block 46 of FIG. 7 shows that magnet control 16 and frequency control 20 gradually adjust the clock magnetic field B and local oscillator frequency $\nu_q$ back to their predetermined values given by equations (8) and (9). This action can limit the fluctuations of a resonance variable to values less than the resonance linewidth, divided by the signal-to-noise ratio. Consequently, feedback loop 21 and feedback loop 22 based on the end resonance j, with linewidth $\Delta\nu_j$ and signal-to-noise ratio $S_j$ can confine the fluctuations of $e_j$ to a strip in the ($\delta$B; $\delta\nu_q$) plane defined by the two lines $$e_j = \pm\frac{\Delta\nu_j}{S_j}. \tag{22}$$

As illustrated in FIG. 5, the Zeeman locking strip of equation (22) with j=z has a width $2\Delta\nu_z/n_zS_z$ (along the frequency-fluctuation axis) and a slope $d(\delta\nu_q)/d(\delta B)=\gamma/n_z[I]$. The microwave locking strip of equation (22) with j=m has a much smaller width $2\Delta\nu_m/n_mS_m$ along the frequency fluctuation axis, and it has a much smaller slope $d(\delta\nu_q)/d(\delta B)=2I\gamma/n_m[I]$. Both the width and the slope of the microwave resonance are much smaller than those of the Zeeman resonance because the harmonic index $n_m$ of the microwave resonance is some four orders of magnitude larger than $n_z$, the harmonic index (or the inverse subharmonic index $1/p_z$) of the Zeeman resonance. The fluctuations will be confined to the intersection of these two strips, the parallelogram shown in FIG. 5. From the geometry of FIG. 5 it is shown that the bound on the magnetic field fluctuation is $$\delta B = \frac{[I]\Delta\nu_z}{\gamma S_z}. \tag{23}$$

Similarly, the upper right-hand point of the parallelogram in FIG. 5 has a projection on the frequency axis, given by $$\delta\nu_q = \frac{\Delta\nu_m}{n_mS_m} + \frac{2I\Delta\nu_z}{n_mS_z}. \tag{24}$$

The combined Zeeman and microwave end resonances therefore allow controlling the relative clock frequency to $$\frac{\delta\nu_c}{\nu_c} = \frac{n_m\delta\nu_q}{\nu_{hf}} = \frac{\Delta\nu_m}{\nu_{hf}S_m} + \frac{2I\Delta\nu_z}{\nu_{hf}S_z}. \tag{25}$$

Experiments with end resonances of $^{87}$Rb have demonstrated experimental values $\Delta\nu_m$=2 kHz and $\Delta\nu_z$=0.8 kHz. With signal acquisition bandwidths of about 1 Hz, and signal-to-noise ratios of $S_m=S_z\approx200$, using equation (25) a predicted uncertainty of the clock frequency is $$\frac{\delta\nu_c}{\nu_c} = 2.5\times10^{-9}. \tag{26}$$

Figure 6:
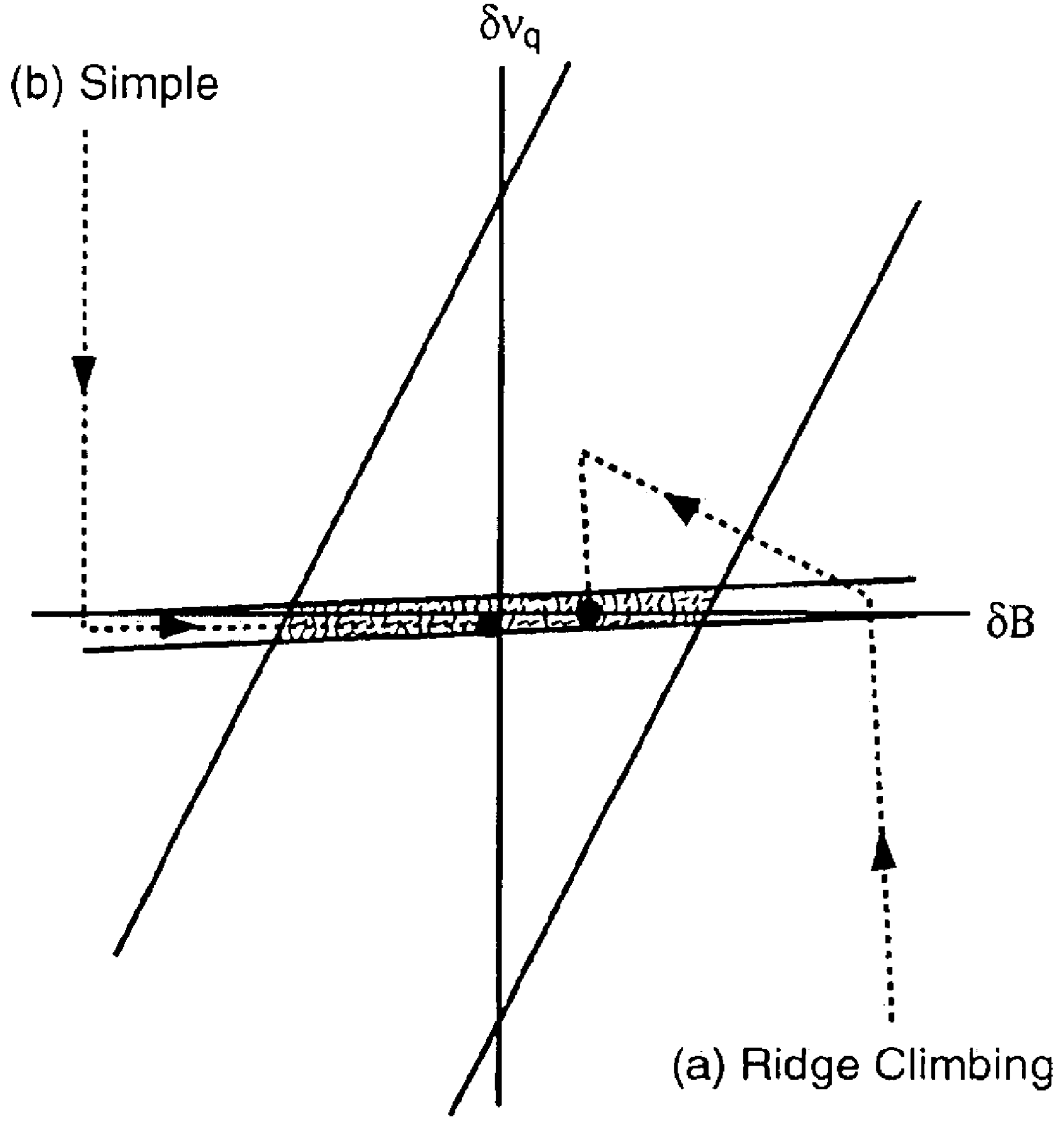
FIG. 6 is s graph of trajectories in $\delta B$-$\delta\nu_q$ plane for locking the field B and frequency $\nu_q$ for: (a) ridge-climbing combinations; and (b) for simple modulation of B for locking to the Zeeman end resonance, and $\nu_q$ for locking to the microwave end resonance.

In an alternate embodiment, B is dithered to lock to the Zeeman resonance and $\nu_q$ is dithered to lock to the microwave resonance. FIG. 6 compares sequential locking trajectories for ridge-climbing dither amplitudes with the scheme where B is dithered to lock to the Zeeman resonance and $\nu_q$ is dithered to lock to the microwave resonance.

The present invention can be used for operating an atomic clock or a magnetometer. In the description of the present invention, an ambient magnetic field is the filed produced at the cell 12 by all the objects located outside the embodiment, such as the Earth, the building or the vehicle that the apparatus is in. In the use of a magnetometer, the ambient magnetic field is the field that is measured.

An adjustable magnetic field is created by means 15, 16 in addition to the ambient magnetic field described above in order to stabilize a total magnetic field which is the sum of the ambient magnetic field and the adjustable magnetic field. In use of an atomic clock, the total magnetic field is stabilized to improve the frequency stability of the clock. In use of a magnetometer, the total magnetic field is stabilized such that a measure of the adjustable magnetic field becomes a measure of the ambient magnetic field.

The "clock field" is the desired value of the ambient magnetic field and the adjustable magnetic field, and the feed-back circuits of the present invention change the adjustable magnetic field in such a way that actual sum of the ambient magnetic field and the adjustable magnetic field does not deviate from the "clock field" by more than is shown by the error parallelograms in FIGS. 5 and 6.

In one of the embodiments, alternating magnetic fields oscillating at resonance frequencies of the two end resonances are used to excite the resonances. These alternating magnetic fields are the magnetic components of the microwave radiation used in the embodiments. These alternating magnetic fields oscillate so rapidly around their mean zero values that they do not directly contribute to the balance of the ambient magnetic field and the adjustable magnetic field.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed is:

1. A method for operating an atomic clock comprising the steps of:

a. optically pumping atoms into a ground-state sublevel of maximum or minimum spin from which end resonances can be excited;

b. simultaneously exciting a microwave end resonance and a Zeeman end resonance from a same end state of the atoms either by:

pumping the atoms with constant-intensity, circularly-polarized optical pumping light and applying two alternating magnetic fields, one of the alternating magnetic fields oscillating at a microwave frequency of the microwave end resonance and the other of the alternating magnetic fields oscillating at a radio frequency of the Zeeman end resonance, or pumping the atoms with modulated circularly-polarized optical pumping light simultaneously modulated at the frequency of the microwave end resonance and at the frequency of the Zeeman end resonance to produce coherent population trapping resonances; and c. detecting that the microwave end resonance and Zeeman end resonance have been excited.

2. The method of claim 1 wherein in step c., the detection of the microwave end resonance and the Zeeman end resonance is through changes in the attenuation of the optical pumping light.

3. The method of claim 1 wherein in step c., the detection of the microwave end resonance and the Zeeman end resonance is through changes in the fluorescent emission of the light by the atoms.

4. The method of claim 1 wherein the microwave frequency and Zeeman frequency are a harmonic or subharmonic of a local oscillator frequency, to provide a ratio of the microwave frequency and the Zeeman frequency which is a fixed ratio of integers for defining a fixed value of a total magnetic field which is the clock field and a fixed value of the local-oscillator frequency which is a clock frequency.

5. The method of claim 4 further comprising the step of:

applying an adjustable magnetic field to the atoms to produce a clock field which is a substantially constant total field.

6. The method of claim 5 further comprising the step of:

adjusting the local-oscillator frequency and the applied adjustable magnetic field to maximize amplitudes of the microwave end resonance and Zeeman end resonance.

7. The method of claim of 6 further comprising the steps of:

dithering the local-oscillator frequency at an oscillator-dither frequency; and dithering the applied adjustable magnetic field at a distinct field-dither frequency to generate error signals in the amplitudes of the microwave end resonance and Zeeman end resonance for correcting drift of a local-oscillator frequency from the clock frequency and for correcting drift of a total of ambient magnetic field and adjustable magnetic field from the clock field.

8. The method of claim 1 wherein the atoms are pumped with circularly polarized light at the resonance wavelength for the atoms.

9. A system for operating an atomic clock comprising:

means for optically pumping atoms into a ground-state sublevel of maximum or minimum spin from which end resonances can be excited;

means for simultaneously exciting a microwave end resonance and a Zeeman end resonance from a same end state of the atoms using either:

means for pumping the atoms with constant-intensity, circularly-polarized optical pumping light and applying two alternating magnetic fields, one of the alternating magnetic fields oscillating at a microwave frequency of the microwave end resonance and the other of the alternating magnetic fields oscillating at a radio frequency of the Zeeman end resonance, or means for pumping the atoms with modulated circularly-polarized optical pumping light simultaneously modulated at the frequency of the microwave end resonance and at the frequency of the Zeeman end resonance to produce coherent population trapping resonances; and means for detecting that the microwave end resonance and Zeeman end resonance have been excited.

10. The system of claim 9 wherein the detection of the microwave end resonance and the Zeeman end resonance is through changes in the attenuation of the optical pumping light.

11. The system of claim 9 wherein the detection of the microwave end resonance and the Zeeman end resonance is through changes in the fluorescent emission of the light by the atoms.

12. The system of claim 9 wherein the microwave frequency and Zeeman frequency are a harmonic or subharmonic of a local oscillator frequency, to provide a ratio of the microwave frequency and the Zeeman frequency which is a fixed ratio of integers for defining a fixed value of a total magnetic field which is the clock field and a fixed value of the local-oscillator frequency which is the clock frequency.

13. The system of claim 12 further comprising:

means for applying an adjustable magnetic field to the atoms to produce a clock field which is a substantially constant total field.

14. The system of claim 13 further comprising:

means for adjusting the local-oscillator frequency and the applied adjustable magnetic field to maximize amplitudes of the microwave end resonance and Zeeman end resonance.

15. The system of claim of 14 further comprising:

means for dithering the local-oscillator frequency at an oscillator-dither frequency; and means for dithering the applied adjustable magnetic field at a distinct field-dither frequency to generate error signals in the amplitudes of the microwave end resonance and Zeeman end resonance for correcting drift of a local-oscillator frequency from the clock frequency and for correcting drift of a total of ambient magnetic field and adjustable magnetic field from the clock field.

16. The system of claim 9 wherein the atoms are pumped with circularly polarized light at the resonance wavelength for the atoms.

17. A method for operating a magnetometer comprising the steps of:

a. optically pumping atoms into a ground-state sublevel of maximum or minimum spin from which end resonances can be excited;

b. simultaneously exciting a microwave end resonance and a Zeeman end resonance from a same end state of the atoms either by:

pumping the atoms with constant-intensity, circularly-polarized optical pumping light and applying two alternating magnetic fields, one of the alternating magnetic fields oscillating at a microwave frequency of the microwave end resonance and the other of the alternating magnetic fields oscillating at a radio frequency of the Zeeman end resonance, or pumping the atoms with modulated circularly-polarized optical pumping light simultaneously modulated at the frequency of the microwave end resonance and at the frequency of the Zeeman end resonance to produce coherent population trapping resonances; and c. detecting that the microwave end resonance and Zeeman end resonance have been excited.

18. The method of claim 17 wherein in step c., the detection of the microwave end resonance and the Zeeman end resonance is through changes in the attenuation of the optical pumping light.

19. The method of claim 17 wherein in step c., the detection of the microwave end resonance and the Zeeman end resonance is through changes in the fluorescent emission of the light by the atoms.

20. The method of claim 17 wherein the microwave frequency and Zeeman frequency are a harmonic or subharmonic of a local oscillator frequency, to provide a ratio of the microwave frequency and the Zeeman frequency which is a fixed ratio of integers for defining a fixed value of the total magnetic field which is the compensated field and the local-oscillator frequency which is a compensated frequency.

21. The method of claim 20 further comprising the step of:

applying an adjustable magnetic field to the atoms to produce a compensated field which is a substantially constant total field.

22. The method of claim 21 further comprising the step of:

adjusting the local-oscillator frequency and the applied adjustable magnetic field to maximize amplitudes of the microwave end resonance and Zeeman end resonance.

23. The method of claim of 22 further comprising the steps of:

dithering the local-oscillator frequency at an oscillator-dither frequency; and dithering the applied adjustable magnetic field at a distinct field-dither frequency to generate error signals in the amplitudes of the microwave end resonance and Zeeman end resonance for correcting drift of a local-oscillator frequency from the compensated frequency and for correcting drift of a total of the ambient magnetic field being measured and adjustable magnetic field from the compensated field.

24. The method of claim 17 wherein the atoms are pumped with circularly polarized light at the resonance wavelength for the atoms.

25. A system for operating a magnetometer comprising:

means for optically pumping atoms into a ground-state sublevel of maximum or minimum spin from which end resonances can be excited;

means for simultaneously exciting a microwave end resonance and a Zeeman end resonance from a same end state of the atoms using either:

means for pumping the atoms with constant-intensity, circularly-polarized optical pumping light and applying two alternating magnetic fields, one of the alternating magnetic fields oscillating at a microwave frequency of the microwave end resonance and the other of the alternating magnetic fields oscillating at a radio frequency of the Zeeman end resonance, or means for pumping the atoms with modulated circularly-polarized optical pumping light simultaneously modulated at the frequency of the microwave end resonance and at the frequency of the Zeeman end resonance to produce coherent population trapping resonances; and means for detecting that the microwave end resonance and Zeeman end resonance have been excited.

26. The system of claim 25 wherein the detection of the microwave end resonance and the Zeeman end resonance is through changes in the attenuation of the optical pumping light.

27. The system of claim 25 wherein the detection of the microwave end resonance and the Zeeman end resonance is through changes in the fluorescent emission of the light by the atoms.

28. The system of claim 25 wherein the microwave frequency and Zeeman frequency are a harmonic or subharmonic of a local oscillator frequency, to provide a ratio of the microwave frequency and the Zeeman frequency which is a fixed ratio of integers for defining a fixed value of the total magnetic field which is the compensated field and a fixed value of the local-oscillator frequency which is a compensated frequency.

29. The system of claim 28 further comprising:

means for applying an adjustable magnetic field to the atoms to produce a compensated field which is a substantially constant total field.

30. The system of claim 29 further comprising:

means for adjusting the local-oscillator frequency and the applied adjustable magnetic field to maximize amplitudes of the microwave end resonance and Zeeman end resonance.

31. The system of claim of 30 further comprising:

means for dithering the local-oscillator frequency at an oscillator-dither frequency; and means for dithering the applied adjustable magnetic field at a distinct field-dither frequency to generate error signals in the amplitudes of the microwave end resonance and Zeeman end resonance for correcting drift of a local-oscillator frequency from the compensated frequency and a total of the ambient magnetic field being measured and adjustable magnetic field from the compensated field.

32. The system of claim 25 wherein the atoms are pumped with circularly polarized light at the resonance wavelength for the atoms.

* * * * *